United States Patent
Kato et al.

(10) Patent No.: US 7,721,239 B2
(45) Date of Patent: May 18, 2010

(54) SEMICONDUCTOR INTEGRATED CIRCUIT WITH CONNECTING LINES FOR CONNECTING CONDUCTIVE LINES OF A MEMORY CELL ARRAY TO A DRIVER

(75) Inventors: Yoshiko Kato, Yokohama (JP); Shigeru Ishibashi, Kawasaki (JP); Mitsuhiro Noguchi, Yokohama (JP); Toshiki Hisada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 492 days.

(21) Appl. No.: 11/624,386

(22) Filed: Jan. 18, 2007

(65) Prior Publication Data

US 2007/0170589 A1 Jul. 26, 2007

(30) Foreign Application Priority Data

Jan. 20, 2006 (JP) ............................ 2006-012908

(51) Int. Cl.
*G06F 17/50* (2006.01)
(52) U.S. Cl. .................. 716/10; 716/8; 716/9; 716/12; 716/13; 716/14
(58) Field of Classification Search ..................... 716/1, 716/8–14; 257/758; 365/185.17
See application file for complete search history.

(56) References Cited

U.S. PATENT DOCUMENTS

| | | | |
|---|---|---|---|
| 6,110,753 A | 8/2000 | Nakamura | |
| 6,396,088 B2 | 5/2002 | Kitsukawa et al. | |
| 6,534,803 B2 | 3/2003 | Ohkubo | |
| 6,861,691 B2 | 3/2005 | Tran | |
| 2003/0107055 A1* | 6/2003 | Watanabe et al. | 257/208 |
| 2005/0173751 A1 | 8/2005 | Ishii et al. | |
| 2005/0270846 A1* | 12/2005 | Watanabe et al. | 365/185.17 |

FOREIGN PATENT DOCUMENTS

| | | |
|---|---|---|
| JP | 2002-151601 | 5/2002 |
| JP | 2005-535118 | 11/2005 |
| KR | 10-2005-0048594 | 5/2005 |

OTHER PUBLICATIONS

U.S. Appl. No. 11/961,398, filed Dec. 20, 2007, Ishibashi.
U.S. Appl. No. 12/164,486, filed Jun. 30, 2008, Kato et al.
U.S. Appl. No. 11/858,634, filed Sep. 20, 2007, Kato et al.

* cited by examiner

*Primary Examiner*—Vuthe Siek
(74) *Attorney, Agent, or Firm*—Oblon, Spivak, McClelland, Maier & Neustadt, L.L.P.

(57) ABSTRACT

A semiconductor integrated circuit according to the present invention includes a cell array composed of elements, conductive lines with a pattern of a line & space arranged on the cell array, connecting lines formed upper than the conductive lines, and contact holes which connect the conductive lines to the connecting lines. One end side of the conductive lines sequentially departs from an end of the cell array when heading from one of the conductive lines to another one, the contact holes are arranged at one end side of the conductive lines, and size of the contact holes is larger than width of the conductive lines.

10 Claims, 17 Drawing Sheets

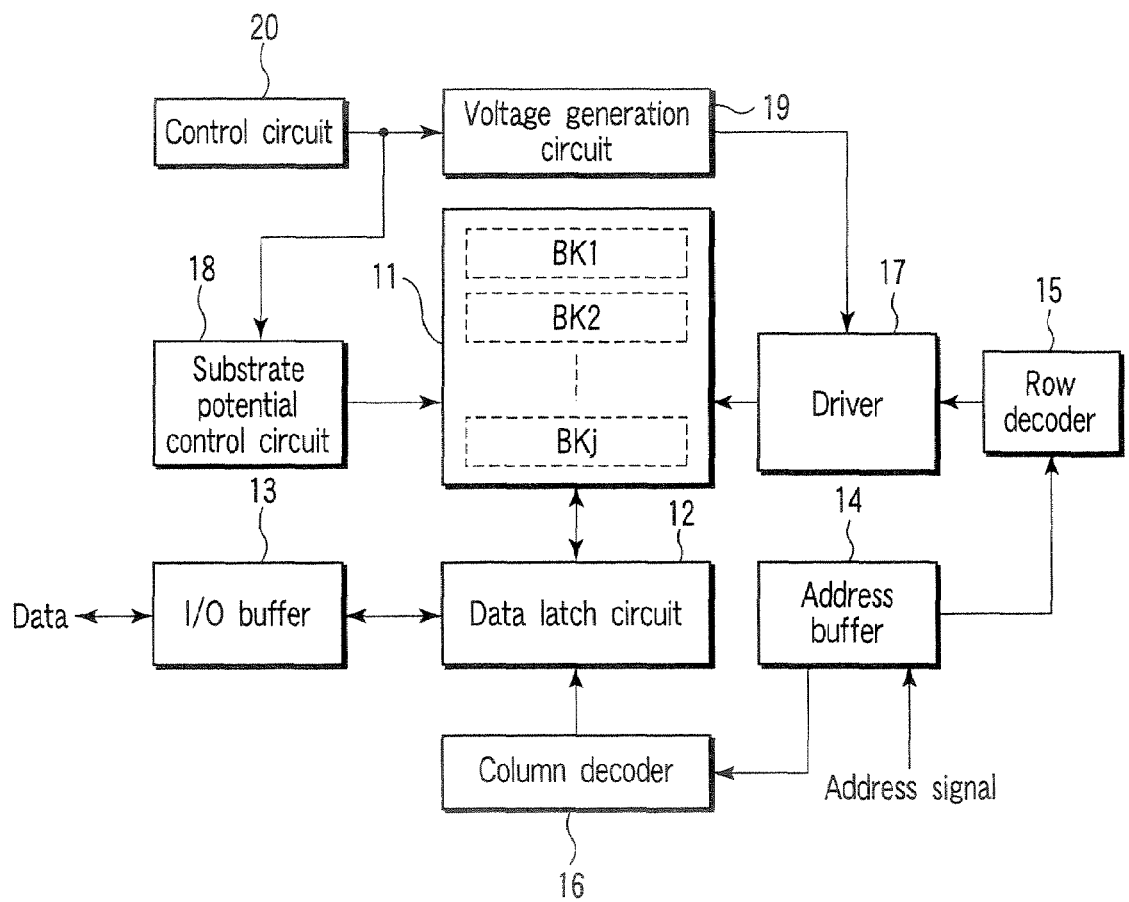
F I G. 1

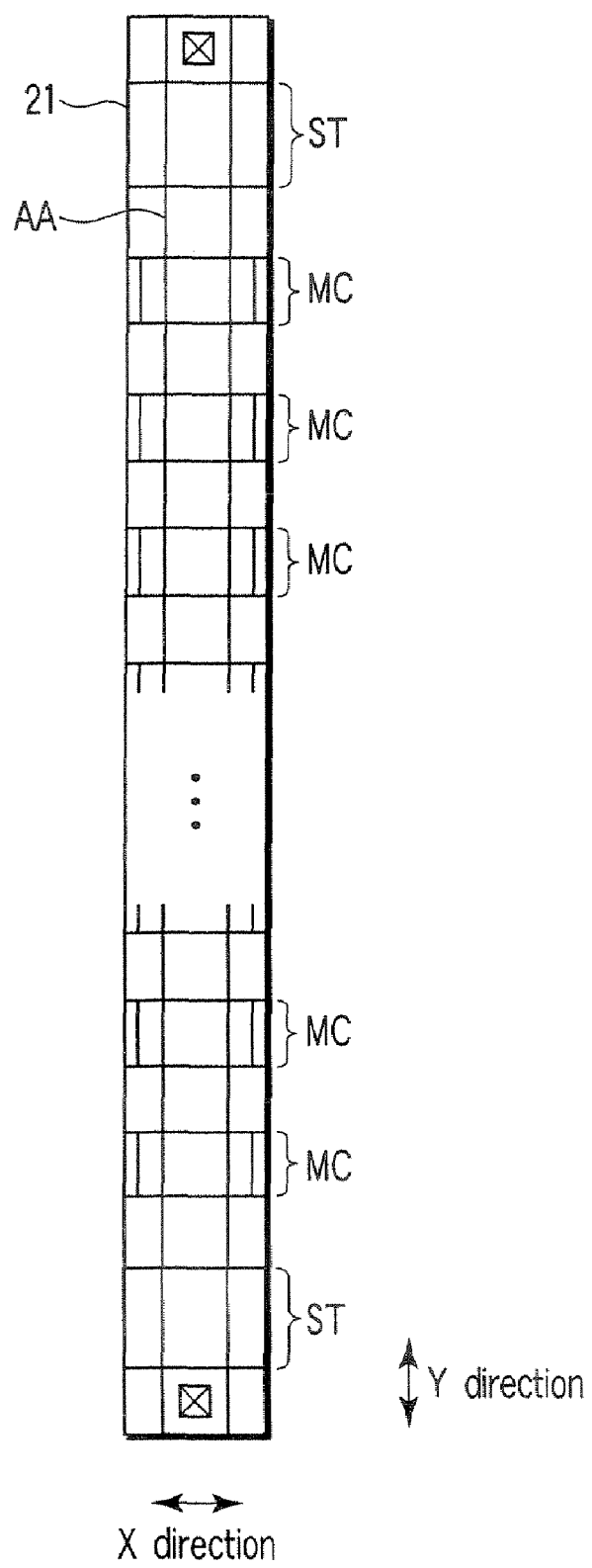
F I G. 3

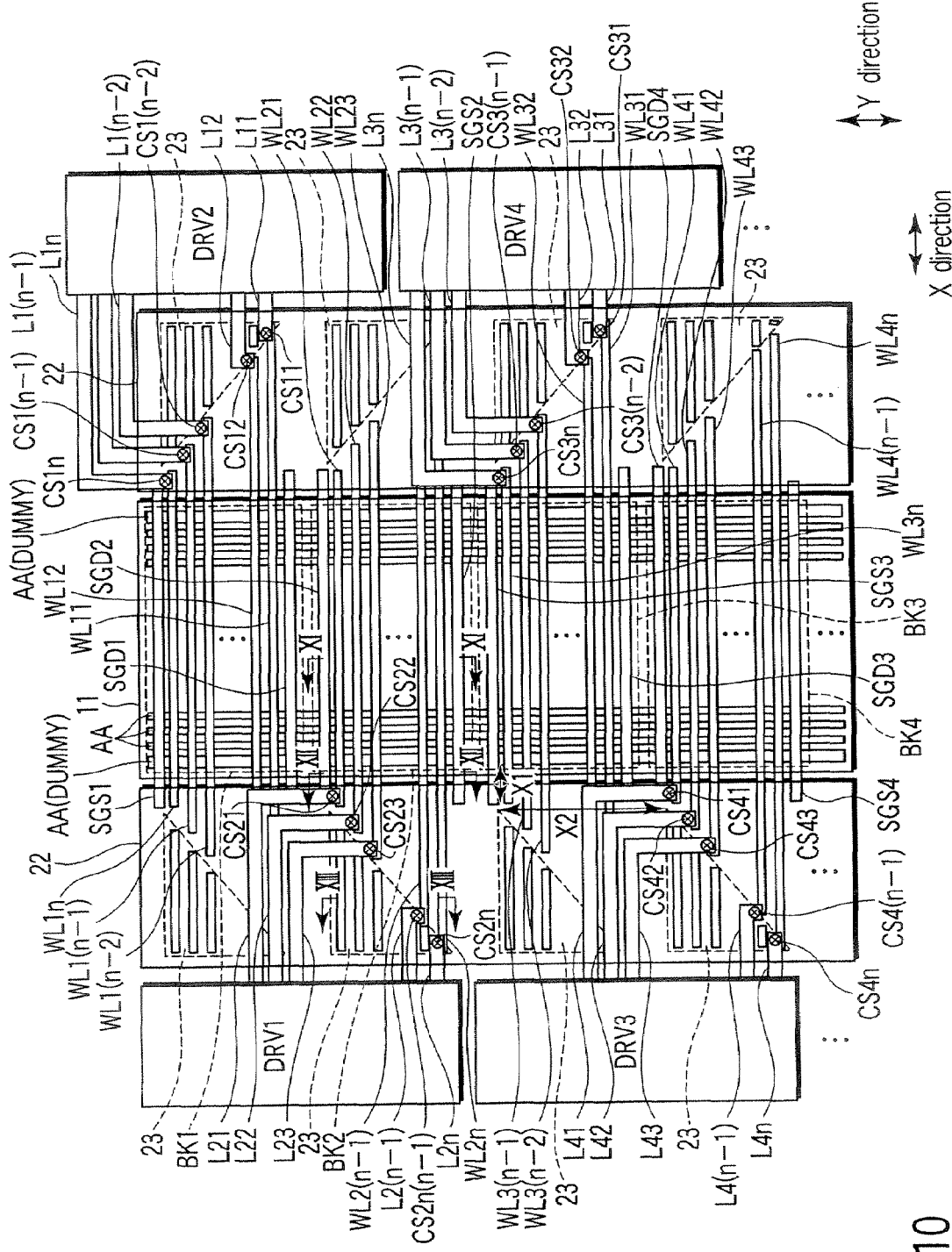
F I G. 10

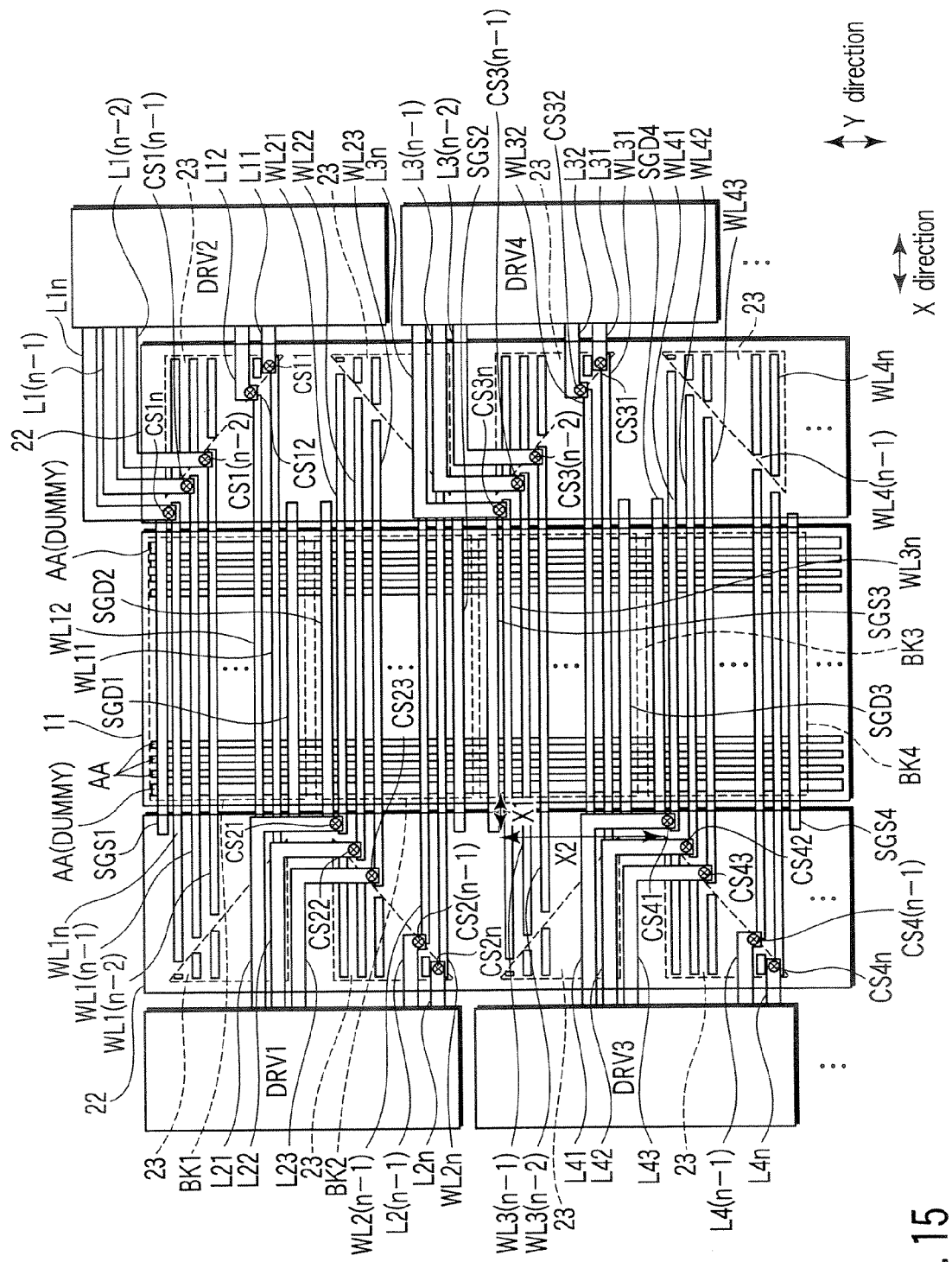
F I G. 15

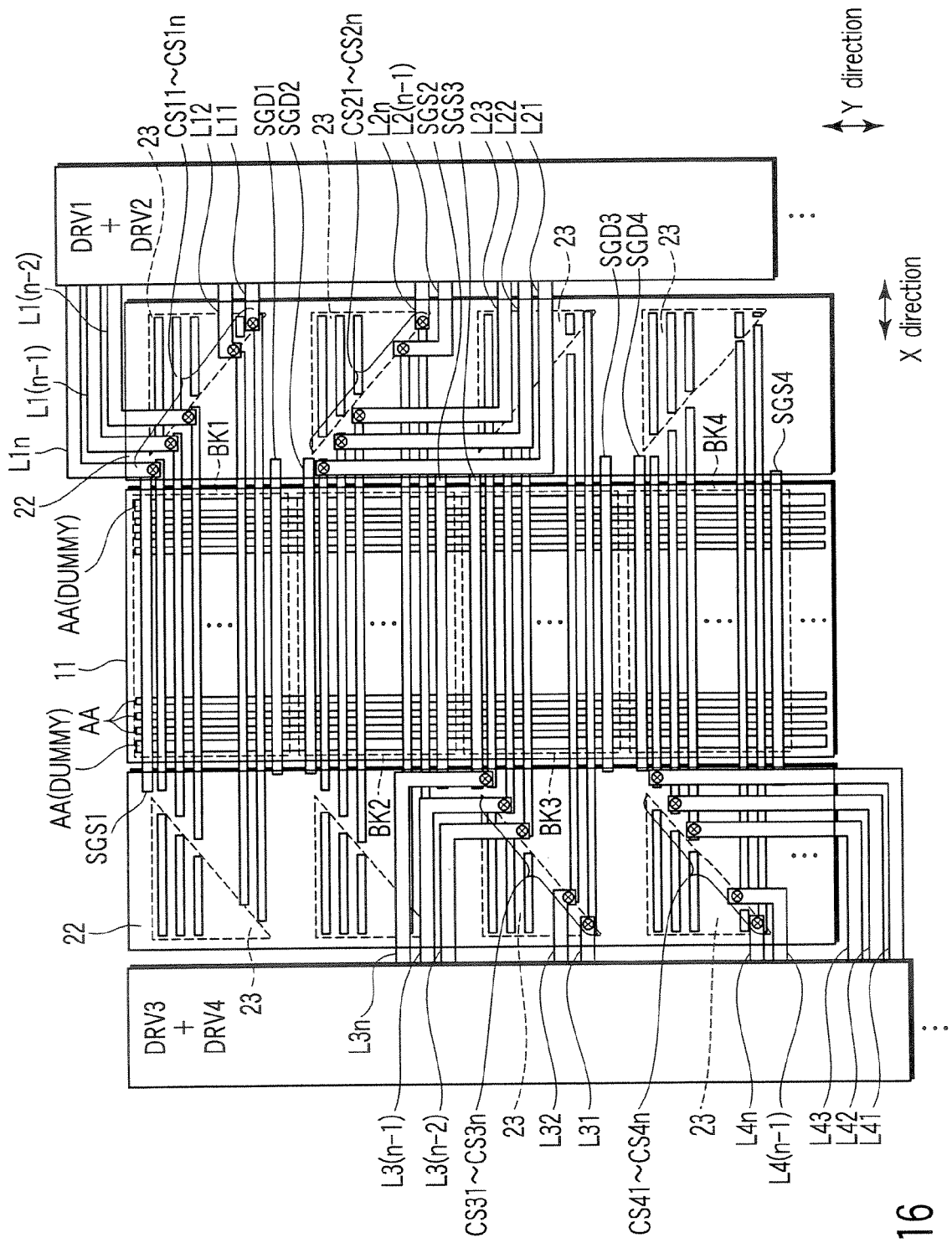
F I G. 16

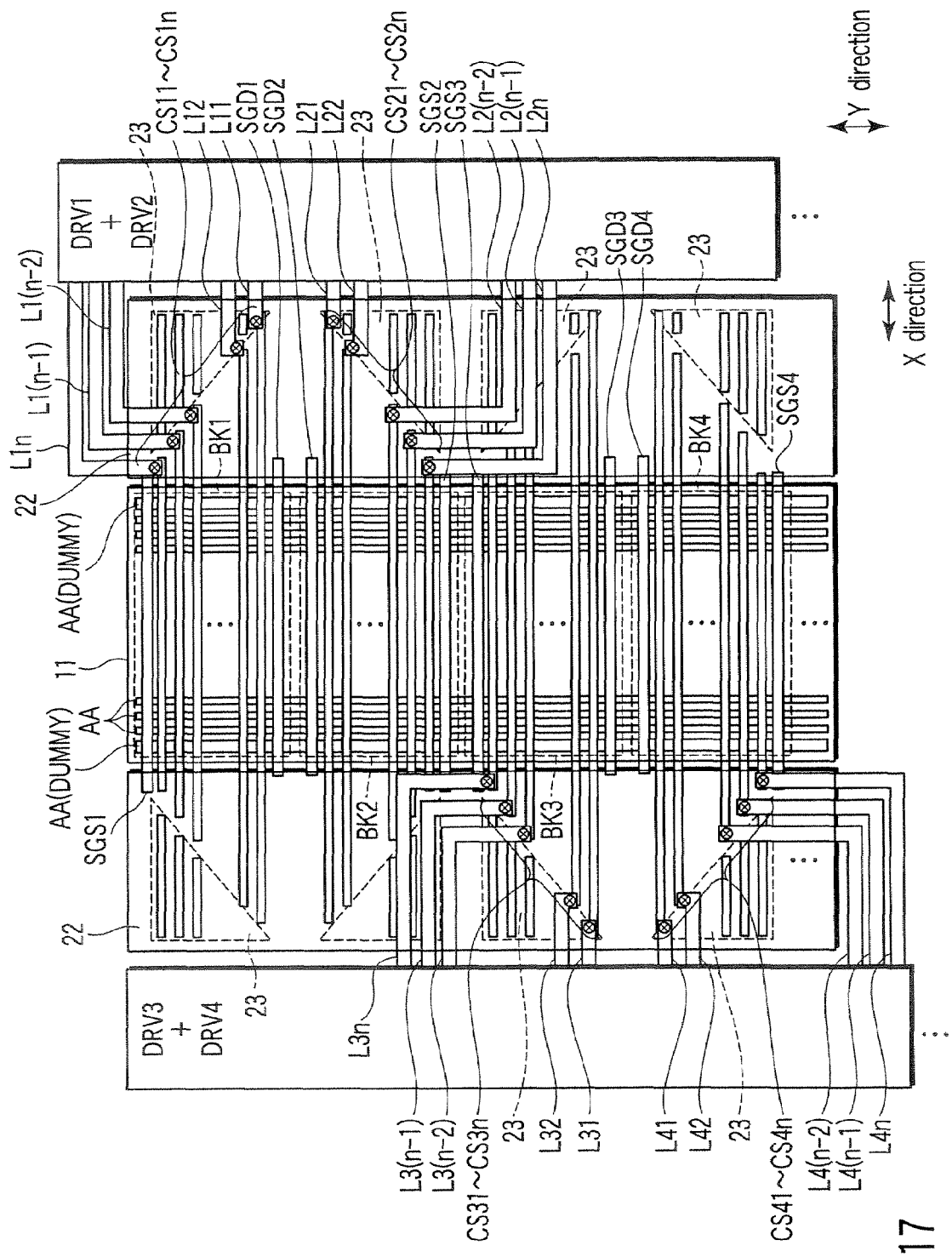
F I G. 17

SEMICONDUCTOR INTEGRATED CIRCUIT WITH CONNECTING LINES FOR CONNECTING CONDUCTIVE LINES OF A MEMORY CELL ARRAY TO A DRIVER

CROSS-REFERENCE TO RELATED APPLICATIONS

This application is based upon and claims the benefit of priority from prior Japanese Patent Application No. 2006-012908, filed Jan. 20, 2006, the entire contents of which are incorporated herein by reference.

BACKGROUND OF THE INVENTION

1. Field of the Invention

The present invention relates to a layout of conductive lines having a pattern of a line & space, for instance, which is used for a semiconductor memory with a large memory capacity.

2. Description of the Related Art

In recent years, many electronic apparatuses using a NAND-type flash memory as a main memory have been commercialized. On the other hand, an increase of storage capacity of the NAND-type flash memory becomes a problem as the function of the electronic apparatus increases.

When achieving the increase of the storage capacity, chip layout is very important. For instance, although miniaturization of the memory cell has progressed remarkably, in order to achieve improvement of reliability while eliminating problems such as disconnection, short circuit, or the like of conductive lines, size or pitch of the conductive lines or contact holes should be determined in consideration of deviation of alignment in a photolithography (Jpn. Pat. Appln. KOKAI Publication No. 2002-151601).

In particular, even though word lines are formed with minimum processing size (feature size) by a pattern of line & space, in order to connect the word lines with a word line driver, for instance, it becomes necessary to provide connecting lines made of metal. Therefore, investigation of a layout of a connecting area connecting the word lines and the connecting lines is indispensable for reduction of a chip size, and further for an increase of storage capacity.

Similarly, such problem occurs to a semiconductor memory with a large memory capacity in addition to the NAND-type flash memory.

BRIEF SUMMARY OF THE INVENTION

A semiconductor integrated circuit according to the present invention comprises a cell array composed of elements, conductive lines with a pattern of a line & space arranged on the cell array, connecting lines formed upper than the conductive lines, and contact holes which connect the conductive lines to the connecting lines. One end side of the conductive lines sequentially departs from an end of the cell array when heading from one of the conductive lines to another one, the contact holes are arranged at one end side of the conductive lines, and size of the contact holes is larger than width of the conductive lines.

BRIEF DESCRIPTION OF THE SEVERAL VIEWS OF THE DRAWING

FIG. 1 is a block diagram showing a principal part of a NAND-type flash memory;

FIG. 3 is a view showing a layout of a cell unit;

FIG. 10 is a view showing a layout as a second embodiment;

FIG. 15 is a view showing a layout as the third embodiment;

FIG. 16 is a view showing a layout as a fourth embodiment;

FIG. 17 is a view showing a layout as the fourth embodiment;

DETAILED DESCRIPTION OF THE INVENTION

Figure 2:
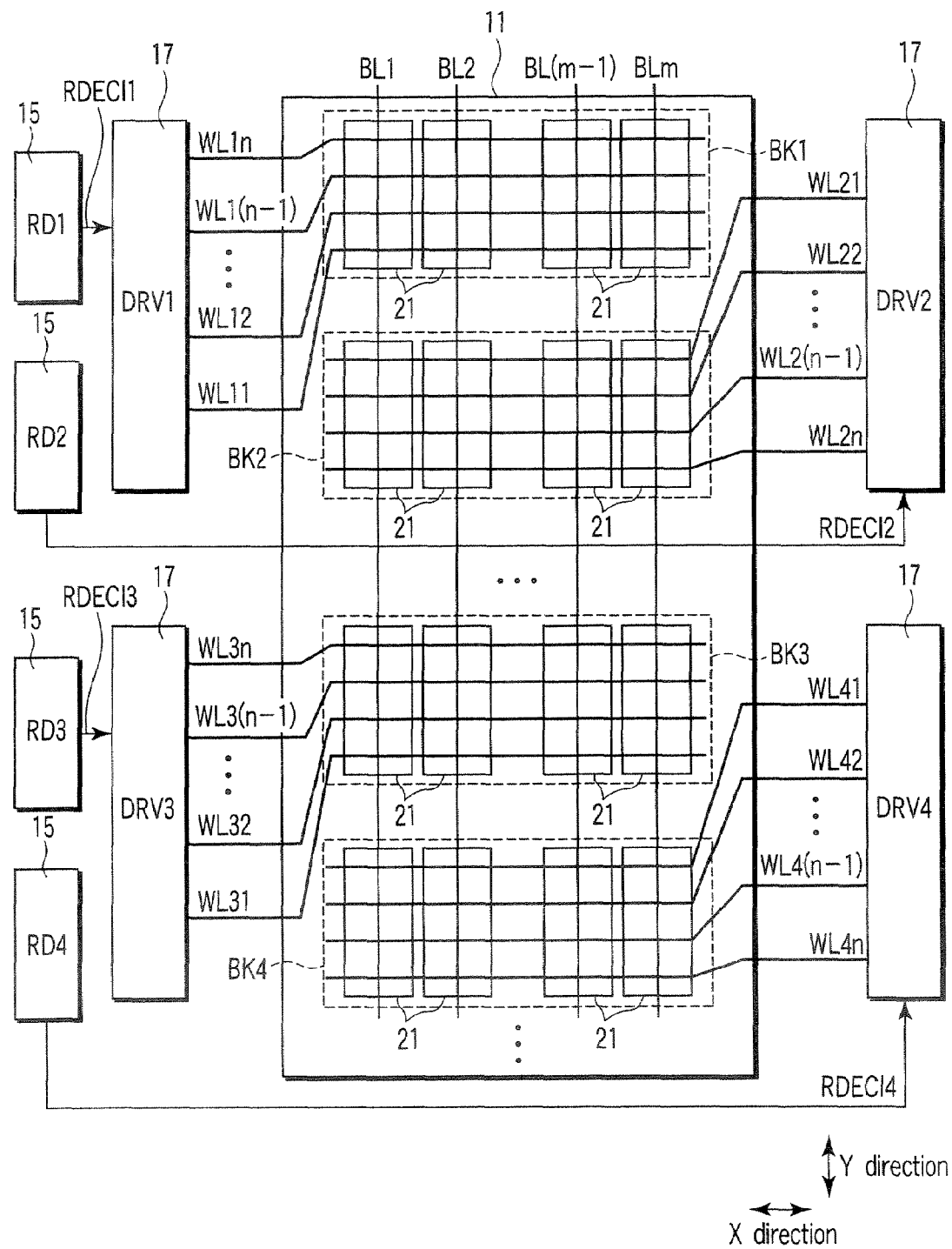
FIG. 2 is a view showing a layout of a memory cell array part.

A semiconductor integrated circuit of an aspect of the present invention will be described below in detail with reference to the accompanying drawings.

1. OUTLINE

An example of the present invention relates to a layout of conductive lines such as word lines, bit lines or the like having a pattern of line & space arranged on a memory cell array. Specifically, one end side of the conductive lines is designed to sequentially depart from an end of the memory cell array when heading from one of the conductive lines to another one.

For instance, when the memory cell array is composed of a block, such layout is adopted every block. Thus, the memory cell array as a whole has a shape that one end side of the conductive lines becomes cutting edge of a saw. Accordingly, when diagonal part is regarded as an edge, it is conceivable that this shape is a single-edge type, and therefore, hereinafter, a pattern of such conductive lines is called as a single-edge shape.

Further, the contact holes whose size is larger than width of the conductive lines are arranged at one end side of the conductive lines. These contact holes are arranged between the conductive lines and the connecting lines, and the connecting lines are connected to a driver for driving the conductive lines.

Here, when it is assumed that a shape of the contact hole is circular, a size of the contact hole is the diameter of the circle. Further, when assuming a shape of the contact hole as being a square, the size of the contact hole is defined as length of its one side, when assuming a shape of the contact hole as being a rectangular, the size of the contact hole is defined as length of a long side, when assuming a shape of the contact hole as being an oval, the size of the contact hole is defined as length of a long axis, and when assuming a shape of the contact hole as being another shape, the size of the contact hole is defined as its maximum width.

Since there is a good chemistry between such layout and miniaturization of the memory cell, it becomes possible to realize reduction of the chip size, and further increase of the storage capacity.

Further, even though deviation of alignment in photolithography occurs, center point of the contact holes is capable of being shifted gradually to side where one end side of the conductive lines approaches an end of the memory cell array with respect to the center line of the conductive lines, it is possible to realize the semiconductor memory with high reliability while preventing problems such as disconnection of the conductive lines, short circuit, or the like.

Further, since it is not necessary to form the contact holes smaller than the minimum processing size (feature size), the manufacturing process is simplified.

2. EMBODIMENT

Next, there will be described an embodiment using a NAND-type flash memory as an example.

(1) General Figure

FIG. 1 shows a general figure of a NAND-type flash memory.

A memory cell array 11 is composed of blocks B1, BK2, ... BLj. Each of the blocks BK1, BK2, ... BLj has a cell unit, and each of the cell units is composed of a NAND string composed of serially connected memory cells, and two select gate transistors connected to both ends thereof one by one.

A data latch circuit 12 has a function to latch data temporarily at the read/write time, and, for instance, is composed of a flip-flop circuit. An input/output (I/O) buffer 13 functions as an interface circuit of the data, and an address buffer 14 functions as an interface circuit of an address signal.

A row decoder 15 and a column decoder 16 select a memory cell within the memory cell array 11 based on the address signal. A word line driver 17 drives the selected word line within the selected block.

A substrate voltage control circuit 18 controls a voltage of a substrate. Specifically, when a double well region composed of an n-type well region and a p-type well region is formed within a p-type semiconductor substrate and the memory cell is formed within the p-type well region, the substrate voltage control circuit controls the voltage of the p-type well region in accordance with an operation mode.

For instance, the substrate voltage control circuit 18 sets the p-type well region to 0 V at the read/write time, and sets the p-type well region to the voltage of 15 V or more and 40 V or less at the erasing time.

A voltage generation circuit 19 generates a voltage to be supplied to the word lines within the selected block.

For instance, the voltage generation circuit 19 generates a read voltage and an intermediate voltage at the read time. The read voltage is applied to the selected word line within the selected block, while the intermediate voltage is applied to non-selected word lines within the selected block.

Further, at the write time, the voltage generation circuit 19 generates a write voltage and an intermediate voltage. The write voltage is applied to the selected word line within the selected block, while the intermediate voltage is applied to non-selected word lines within the selected block.

A control circuit 20 controls operations of, for instance, the substrate voltage control circuit 18 and the voltage generation circuit 19.

(2) Layout of Memory Cell Array Part

FIG. 2 shows a layout of a memory cell array part of a NAND-type flash memory.

Blocks BK1, BK2, BK3, BK4, ... within the memory cell array 11 are arranged in y-direction. Each of the blocks BK1, BK2, BK3, BK4, ... has a cell unit 21 arranged in x-direction.

The cell unit 21 has a layout, for instance, as shown in FIG. 3. That is, the cell unit 21 is arranged within an active area AA long in y-direction. A memory cell MC constitutes a NAND string while being serially connected in y-direction. Select gate transistors ST are connected to both ends of the NAND string respectively.

Word lines WL11, WL12, ... WL1($n-1$), WL1$n$, ... extend in x-direction, while bit lines BL1, BL2, ... BL(m-1), BLm extend in y-direction.

Word line drivers 17 (DRV1, DRV2, DRV3, DRV4, ...) correspond to the blocks BK1, BK2, BK3, BK4, ... However, since it is difficult for one word line driver to be accommodated within y-direction width of one block, the word line driver is arranged evenly on both ends of the memory cell array 11, respectively.

Row decoders 15 (RD1, RD2, RD3, RD4, ...) decode a row address signal to output decoded signals RDECI1, RDECI2, RDECI3, RDECI4, ....

The decoded signals RDECI1, RDECI2, RDECI3, RDECI4, ... are input to the word line drivers 17 (DRV1, DRV2, DRV3, DRV4, ...).

(3) Circuit Example

Figure 4:
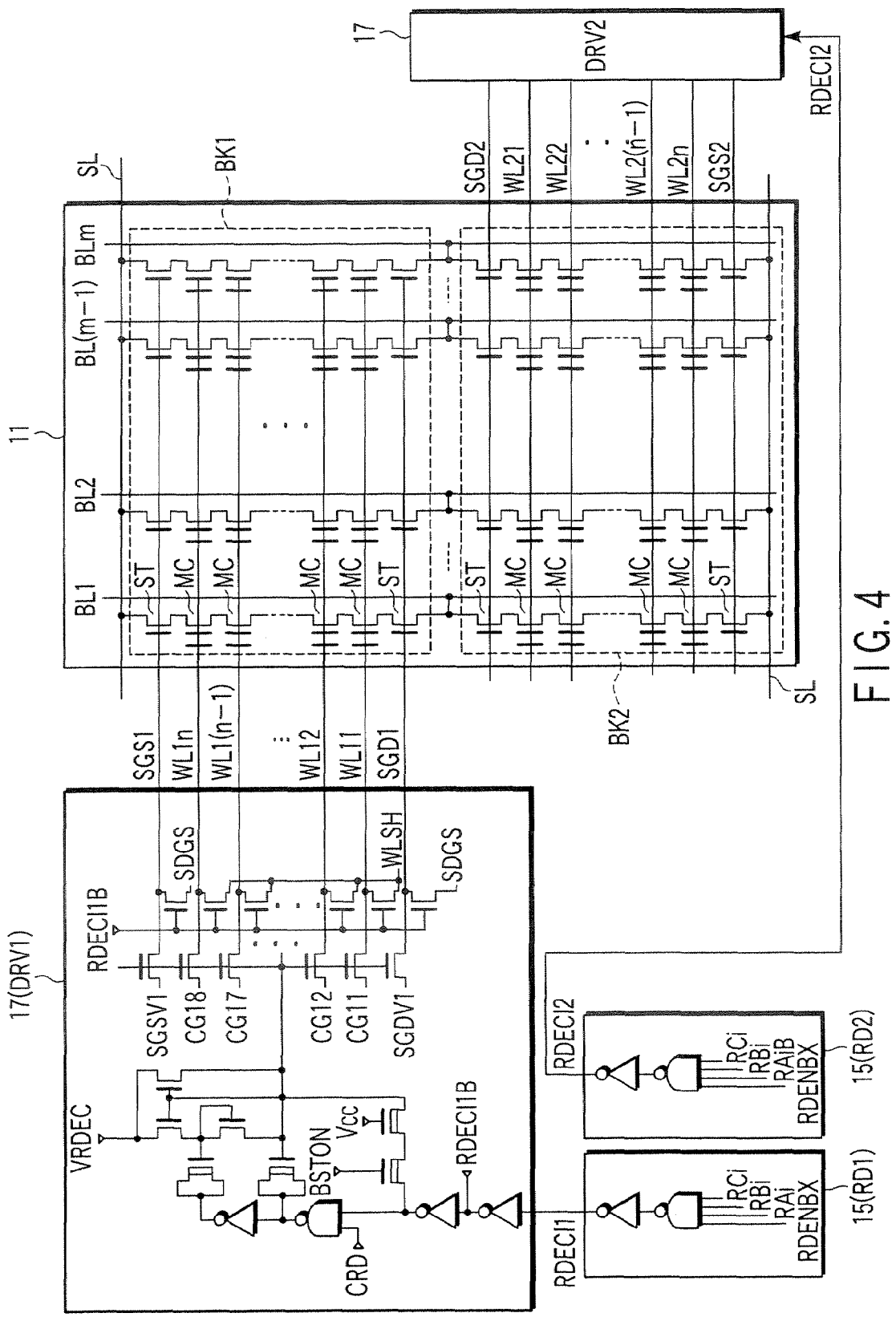
FIG. 4 is a view showing a circuit example of a memory cell array part.

FIG. 4 shows a circuit example of a memory cell array part of the NAND-type flash memory.

As apparent from the same drawing, the number of transistors constituting the word line driver DRV1 is very large. Further, it is also necessary to provide a high withstanding voltage transistor having a larger size than the memory cell in the word line driver DRV1 so as to be able to withstand high voltage at the write time.

Therefore, adopting the layout as described in FIG. 2 is effective for achieving reduction of the chip size and further achieving increase of the storage capacity while effectively arranging a peripheral circuit of the memory cell array.

(4) First Example of Word Lines Layout

Figure 5:
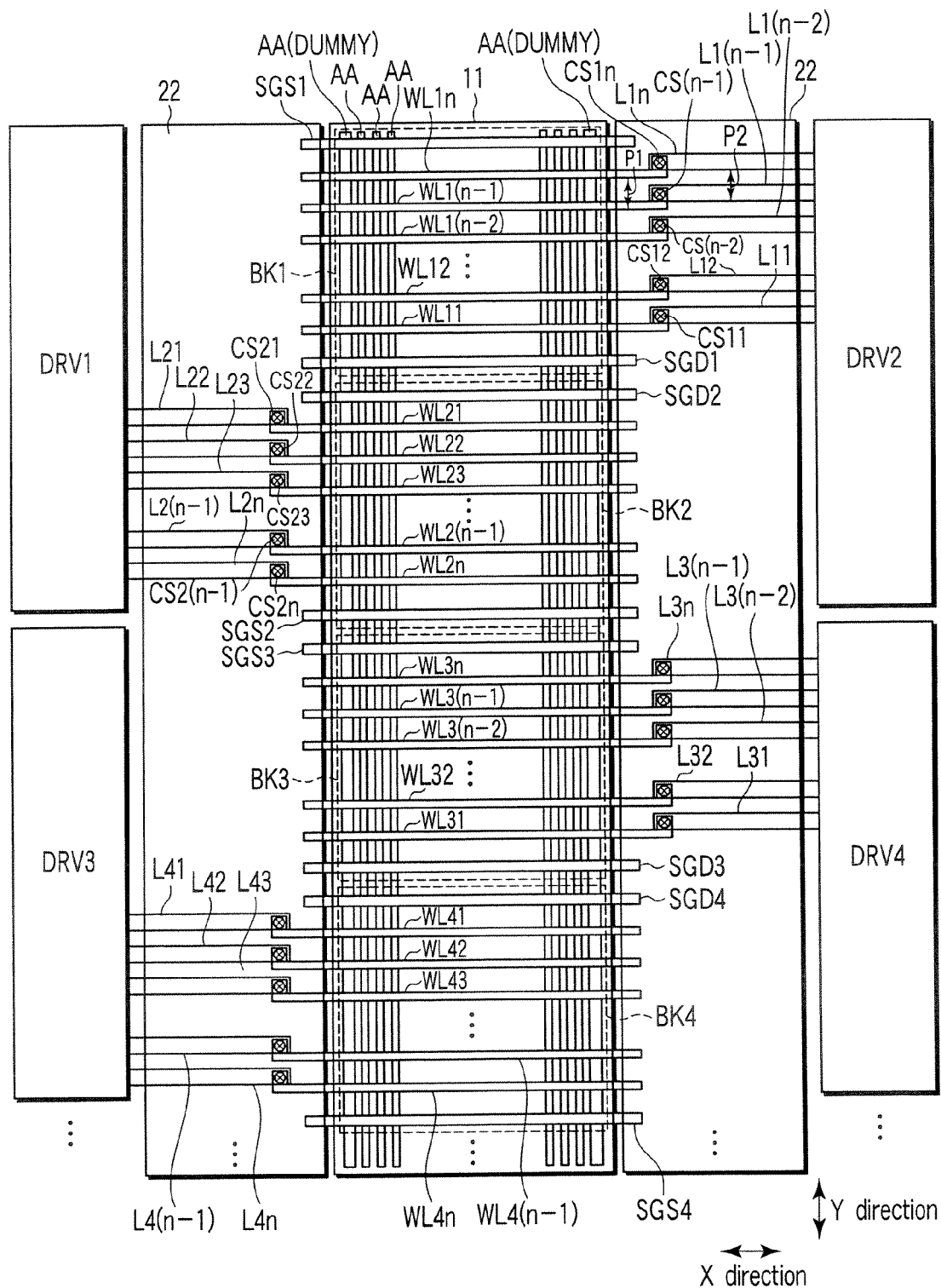
FIG. 5 is a view showing a layout as a reference example.

FIG. 5 shows a first example of the word lines layout as the reference example.

Blocks BK1, BK2, BK3, BK4, ... within the memory cell array 11 are arranged in y-direction. Each of the blocks BK1, BK2, BK3, BK4, ... has a cell unit arranged in x-direction. The cell unit having a layout, for instance, as shown in FIG. 3, is arranged within an active area AA.

One active area nearest to an end in x-direction of the memory cell array 11, or more active areas among the active areas AA are dummy active areas AA (DUMMY) which are not used for storing data.

A cell unit is also formed on the dummy active areas AA (DUMMY). However, this cell unit is dummy. Reason for providing such dummy cell unit is that, largest distortion occurs at the end of the pattern of the line & space, and characteristic of the memory cell deteriorates, if there is no dummy cell unit.

The word lines WL11, WL12, . . . WL1(n−1), WL1n, . . . extend in x-direction on the memory cell array 11, and one end side and other end side thereof exist within connecting areas 22 between the memory cell array 11 and the word line drivers DRV1, . . . .

Connecting lines L11, L12, . . . L1(n−1), L1n, . . . for connecting the word lines WL11, WL12, . . . WL1(n−1), WL1n, . . . to the word line drivers DRV1, . . . are arranged within the connecting area 22.

Width of the connecting lines L11, L12, . . . L1(n−1), L1n, . . . is wider than width of the word lines WL11, WL12, . . . WL1(n−1), WL1n, . . . .

Contact holes CS11, CS12, . . . CS1(n−1), CS1n, . . . are arranged at one end side of the word lines WL11, WL12, . . . WL1(n−1), WL1n, . . . .

Size of the contact holes CS11, CS12, . . . CS1(n−1), CS1n, . . . is larger than width of the word lines WL11, WL12, . . . WL1(n−1), WL1n, . . . .

For this reason, a fringe is provided at one end side of the word lines WL11, WL12, . . . WL1(n−1), WL1n, . . . in consideration of deviation of alignment of the contact holes CS11, CS12, . . . CS1(n−1), CS1n, . . . .

Figure 6:
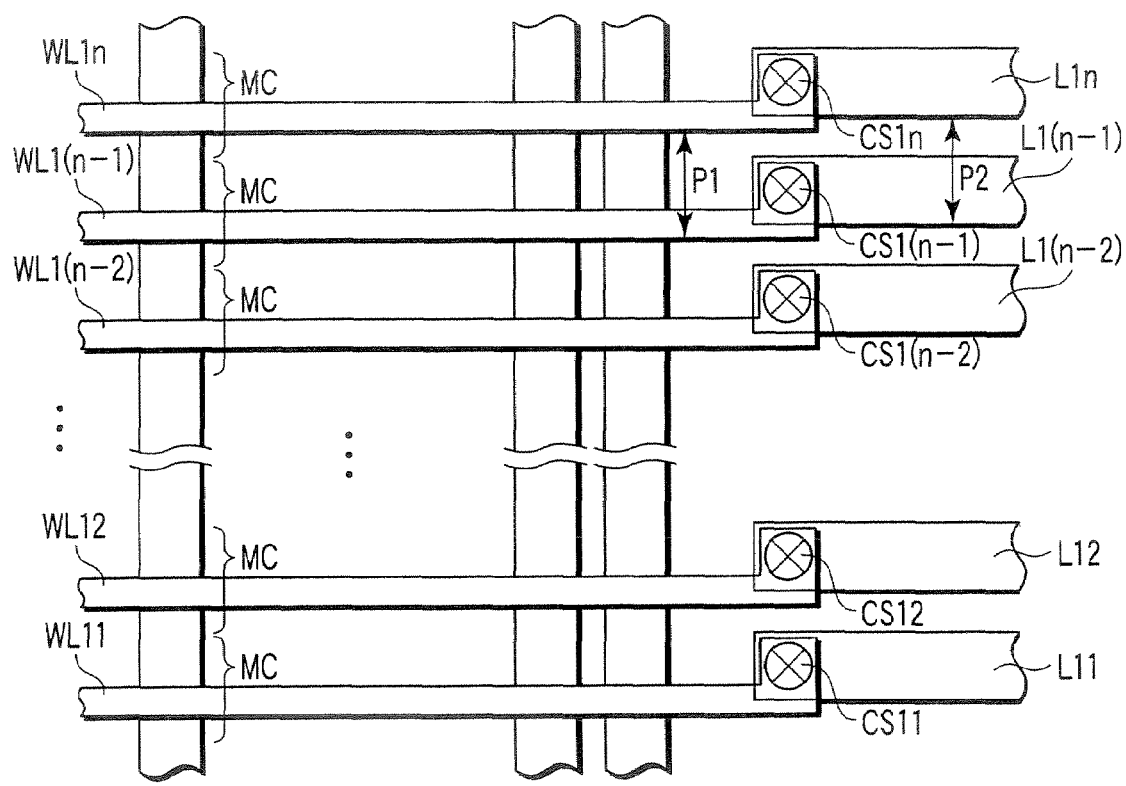
FIG. 6 is a view showing a contact part between a word line and a connecting line.

In this case, for instance, as shown in FIG. 6, even though the memory cell MC is miniaturized, and width of the word lines WL11, WL12, . . . WL1(n−1), WL1n, . . . is narrowed, a pitch P1 thereof is not capable of being narrowed sufficiently because the pitch P1 is restricted by a pitch P2 of the connecting lines L11, L12, . . . L1(n−1), L1n, . . . as long as the pattern of the line & space is maintained.

If the pitch P1 (=P2) of the word lines WL11, WL12, . . . WL1(n−1), WL1n, . . . is forced to narrow, problems such as disconnection, short circuit or the like occur when deviation of alignment on the contact holes CS11, CS12, . . . CS1(n−1), CS1n, . . . or the connecting lines L11, L12, . . . L1(n−1), L1n, . . . occur.

Therefore, such word lines layout is not capable of narrowing width in y-direction of the memory cell array 11 sufficiently, so that it is difficult to reduce the chip size, and further, to achieve increase of the storage capacity.

(5) Second Example of Word Lines Layout

Figure 7:
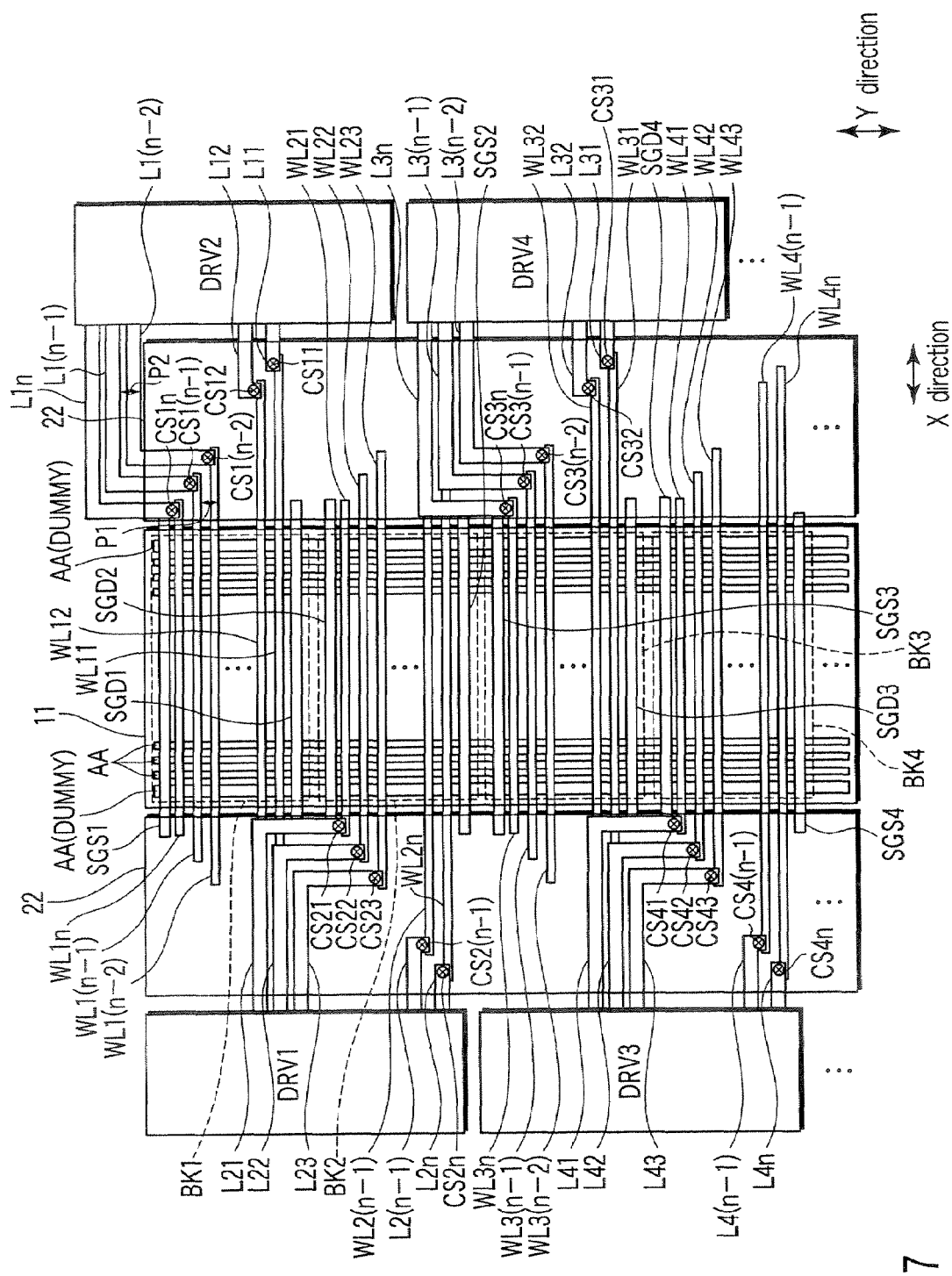
FIG. 7 is a view showing a layout as a first embodiment.

FIG. 7 shows a second example of the word lines layout.

The second example is the layout concerned with the first embodiment.

The blocks BK1, BK2, BK3, BK4, . . . within the memory cell array 11 are arranged in y-direction. Each of the blocks BK1, BK2, BK3, BK4, . . . has a cell unit arranged in x-direction. The cell unit having, for instance, a layout shown in FIG. 3, is arranged within the active area AA.

Among the active areas AA, one or more active areas nearest to an end in x-direction of the memory cell array 11 are dummy active areas AA (DUMMY) which are not used for storing data.

The word lines WL11, WL12, . . . WL1(n−1), WL1n, . . . extend in x-direction on the memory cell array 11, and one end side and other end side thereof exist within the connecting areas 22 between the memory cell array 11 and the word line drivers DRV1, . . . .

One end side and other end side of the word lines WL11, WL12, . . . WL1(n−1), WL1n, . . . have the single-edge shapes within the connecting areas 22.

The connecting lines L11, L12, . . . L1(n−1), L1n, . . . connecting the word lines WL11, WL12, . . . WL1(n−1), WL1n, . . . to the word line drivers DRV1, . . . are arranged within the connecting area 22.

Width of the connecting lines L11, L12, . . . L1(n−1), L1n, . . . is wider than width of the word lines WL11, WL12, . . . WL1(n−1), WL1n, . . . .

Contact holes CS11, CS12, . . . CS1(n−1), CS1n, . . . are arranged at one end side of the word lines WL11, WL12, . . . WL1(n−1), WL1n, . . . .

Size of the contact holes CS11, CS12, . . . CS1(n−1), CS1n, . . . is larger than width of the word lines WL11, WL12, . . . WL1(n−1), WL1n, . . . .

Figure 8:
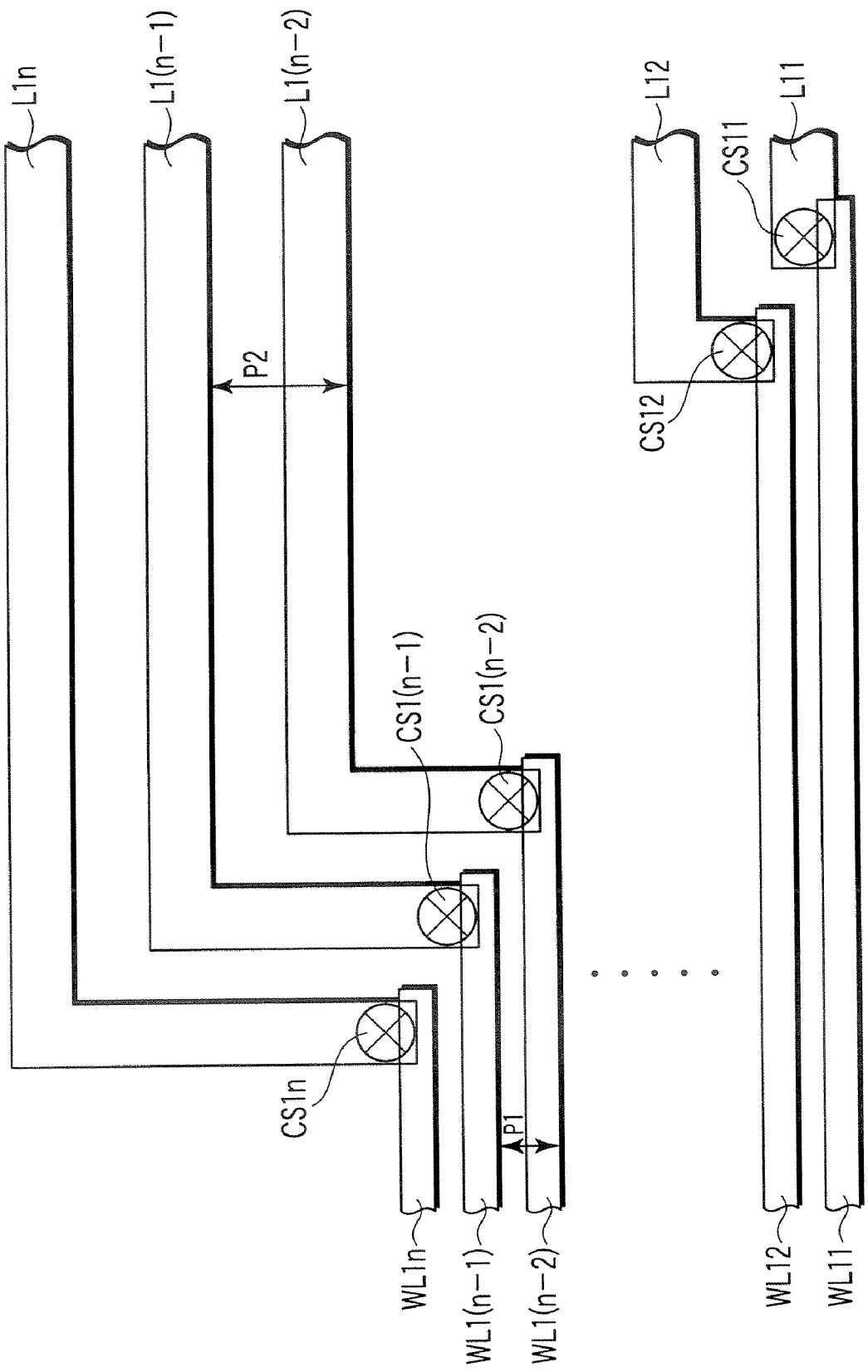
FIG. 8 is a view showing a contact part between a word line and a connecting line.

Further, as shown in FIG. 8, each center point of the contact holes CS11, CS12, . . . CS1(n−1), CS1n, . . . is shifted gradually to one side where one end side of the word lines WL11, WL12, . . . WL1(n−1), WL1n, . . . approaches an end of the memory cell array 11 with respect to each center line of the word lines WL11, WL12, . . . WL1(n−1), WL1n, . . . .

Such one side to which each of the contact holes CS11, CS12, . . . CS1(n−1), CS1n, . . . is shifted is an area in which the word line does not exist. Therefore, there is provided a structure in which the size of the contact holes CS11, CS12, . . . CS1(n−1), CS1n, . . . can be enlarged, and problems such as disconnection, short circuit or the like do not occur in spite of the deviation in alignment.

Thus, in the second example, even though the size of the contact holes CS11, CS12, . . . CS1(n−1), CS1n, . . . is enlarged by forming one end side and other end side of the word lines WL11, WL12, . . . WL1(n−1), WL1n, . . . into the single-edge shapes, disconnection, short circuit caused by the deviation of alignment in photolithography do not occur.

Incidentally, according to the second example, if only one end side of the word lines WL11, WL12, . . . WL1(n−1), WL1n, . . . is formed into the single-edge shape, it is possible to achieve the original purpose. However, since the pattern of the line & space becomes bilaterally symmetrical by forming both the one end side and other end side of the word lines WL11, WL12, . . . WL1(n−1), WL1n, . . . into the single-edge shapes, the layout of the second example is very effective for prevention of dimension fluctuation or simplification of design or the like.

Figure 9:
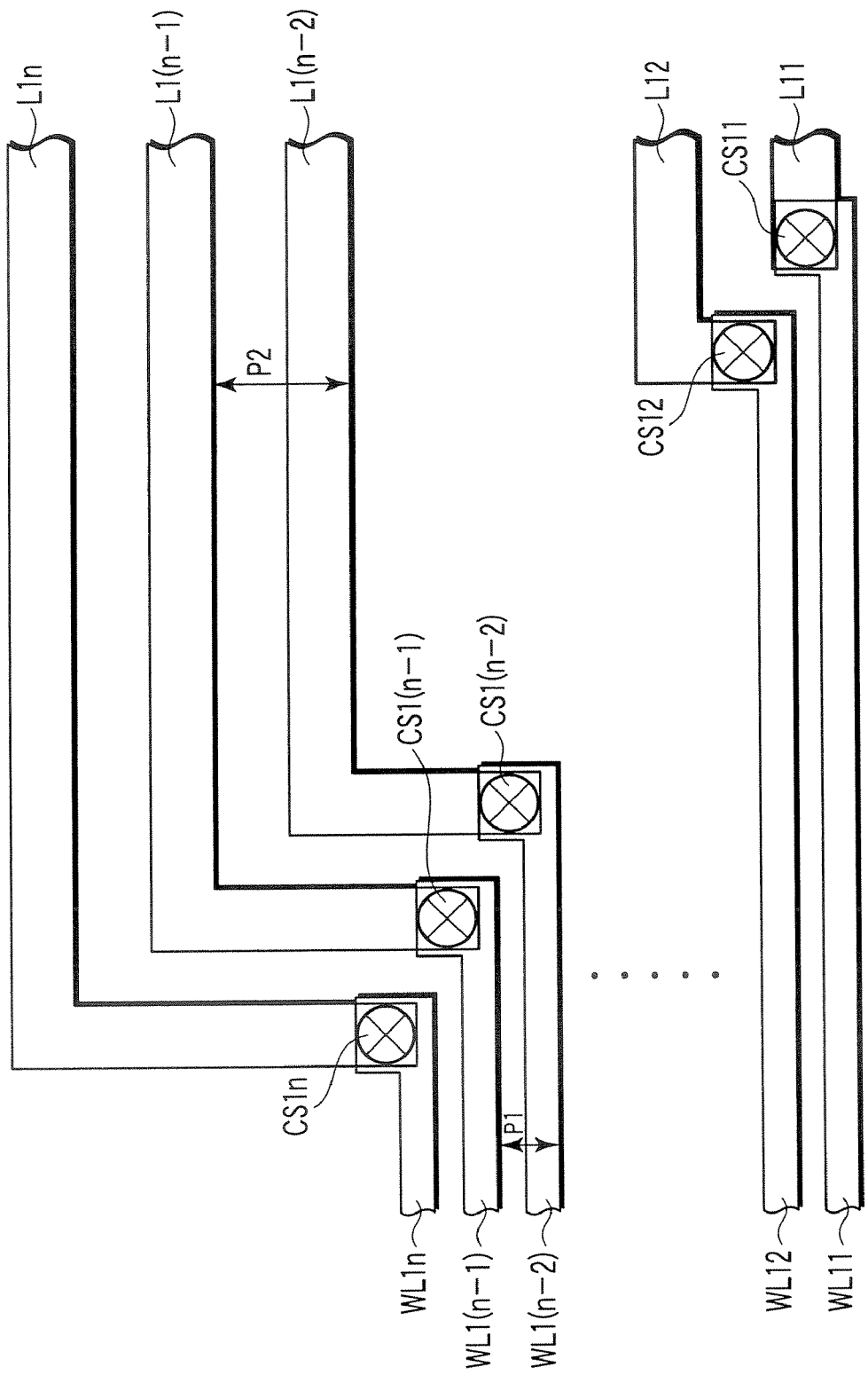
FIG. 9 is a view showing a contact part between a word line and a connecting line.

Further, as shown in FIG. 9, it is possible to provide fringes at one end side of the word lines WL11, WL12, . . . WL1(n−1), WL1n, . . . with the single-edge shape in consideration of deviation of alignment of the contact holes CS11, CS12, . . . CS1(n−1), CS1n, . . . .

As described above, according to the word lines layout of the second example, concerning the word lines WL11, WL12, . . . WL1(n−1), WL1n, . . . , it is possible to narrow the pitch P1 of the word lines WL11, WL12, . . . WL1(n−1), WL1n, . . . without being restricted by the pitch P2 of the connecting lines L11, L12, . . . L1(n−1), L1n, . . . while maintaining the pattern of the line & space.

Therefore, it is possible to narrow sufficiently width in y-direction of the memory cell array 11, and to achieve reduction of the chip size, and further increase of the storage capacity.

Further, to the contrary, concerning the pitch P2 of the connecting lines L11, L12, . . . L1(n−1), L1n, . . . , since it is possible to widen the pitch P2 to about twice the pitch P1 of the word lines WL11, WL12, . . . WL1(n−1), WL1n, . . . , it is possible to contribute to simplification of the process of the connecting lines L11, L12, . . . L1(n−1), L1n, . . . .

(6) Third Example of Word Lines Layout

FIG. 10 shows a third example of the word lines layout.

The third example is the layout concerned with the second embodiment. The layout of the third example, compared to the layout of the second example, is the same as the layout of the second example except that dummy word lines 23 are further added.

One end side and other end side of the word lines WL11, WL12, . . . WL1(n−1), WL1n, . . . , like the second example, have the single-edge shapes within the connecting areas 22.

The dummy word lines 23 with the same width as the word lines WL11, WL12, . . . WL1(n−1), WL1n, . . . are further arranged at distal ends from one end side and other end side of the word lines WL11, WL12, . . . WL1(n−1), WL1n, . . . , while being separated from these word lines WL11, WL12, . . . WL1(n−1), WL1n, . . . .

The dummy word lines 23 are provided to realize flattening of a surface of an interlayer insulating layer arranged on the word lines WL11, WL12, . . . WL1(n−1), WL1n, . . . .

Specifically, when the dummy word lines 23 are not provided, a recess is formed at that position, and a step is produced on a surface of the interlayer insulating layer. As a result, for instance, problems of variations of shape of the connecting lines L11, L12, . . . L1(n−1), L1n, . . . arranged on the interlayer insulating layer, or, in the worst case, disconnection, short circuit or the like occur.

If the dummy word lines 23 are provided, there is no occurrence of these problems.

In particular, in the case where one end side and other end side of the word lines WL11, WL12, . . . WL1(n−1), WL1n, . . . are formed into the single-edge shapes, providing such dummy word lines 23 is very effective means for resolving the above problems.

Incidentally, when combining the word lines with the single-edge shape and the dummy word lines, as the chip layout, a distance X1 from an end of the memory cell array 11 to the dummy word line 23 nearest thereto is shorter than a pitch X2 of an area where the dummy word lines 23 are formed.

Figure 11:
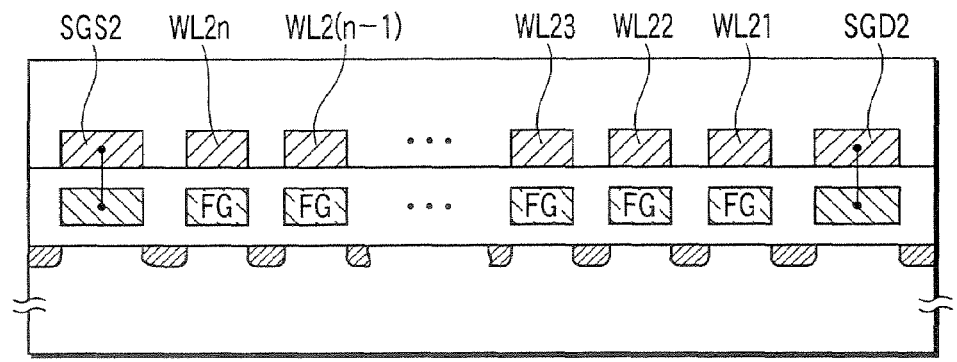
FIG. 11 is a cross-sectional view along a line XI-XI of FIG. 10.
Figure 12:
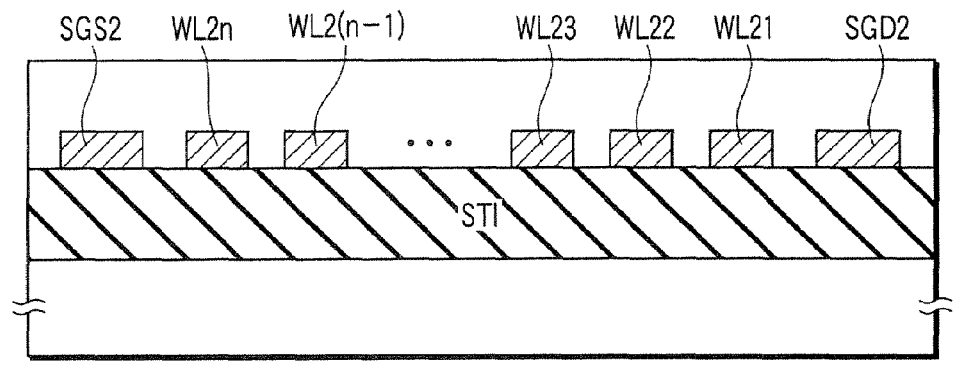
FIG. 12 is a cross-sectional view along a line XII-XII of FIG. 10.
Figure 13:
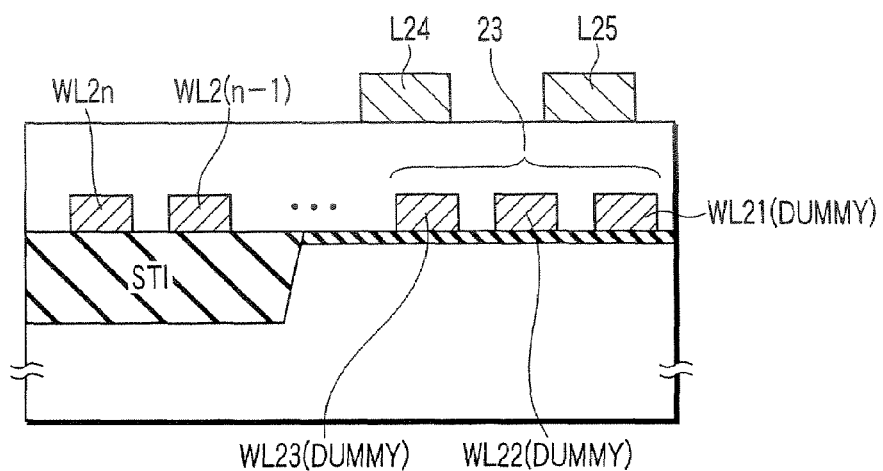
FIG. 13 is a cross-sectional view along a line XIII-XIII of FIG. 10.

FIG. 11 shows a cross section along a line XI-XI of FIG. 10, FIG. 12 shows a cross section along a line XII-XII of FIG. 10, and FIG. 13 shows a cross section along a line XIII-XIII of FIG. 10.

Word lines WL21, WL22, . . . WL2(n−1), WL2n, . . . are arranged regularly with the pattern of the line & space. Similarly, also dummy word lines WL21(DUMMY), WL22(DUMMY), . . . are arranged regularly with the same width and pitch as the word lines WL21, WL22, . . . WL2(n−1), WL2n, . . . .

According to such word lines layout, it is possible to improve reliability of conductive lines formed upper than the word lines WL11, WL12, . . . WL1(n−1), WL1n, . . . by providing the dummy word lines 23.

Further, like the second example, concerning the word lines WL11, WL12, . . . WL1(n−1), WL1n, . . . , it is possible to narrow the pitch P1 thereof, while maintaining the pattern of the line & space. Therefore, it is possible to narrow sufficiently width in y-direction of the memory cell array 11, and to achieve reduction of the chip size, and further increase of the storage capacity.

(7) Fourth Example of Word Lines Layout

Figure 14:
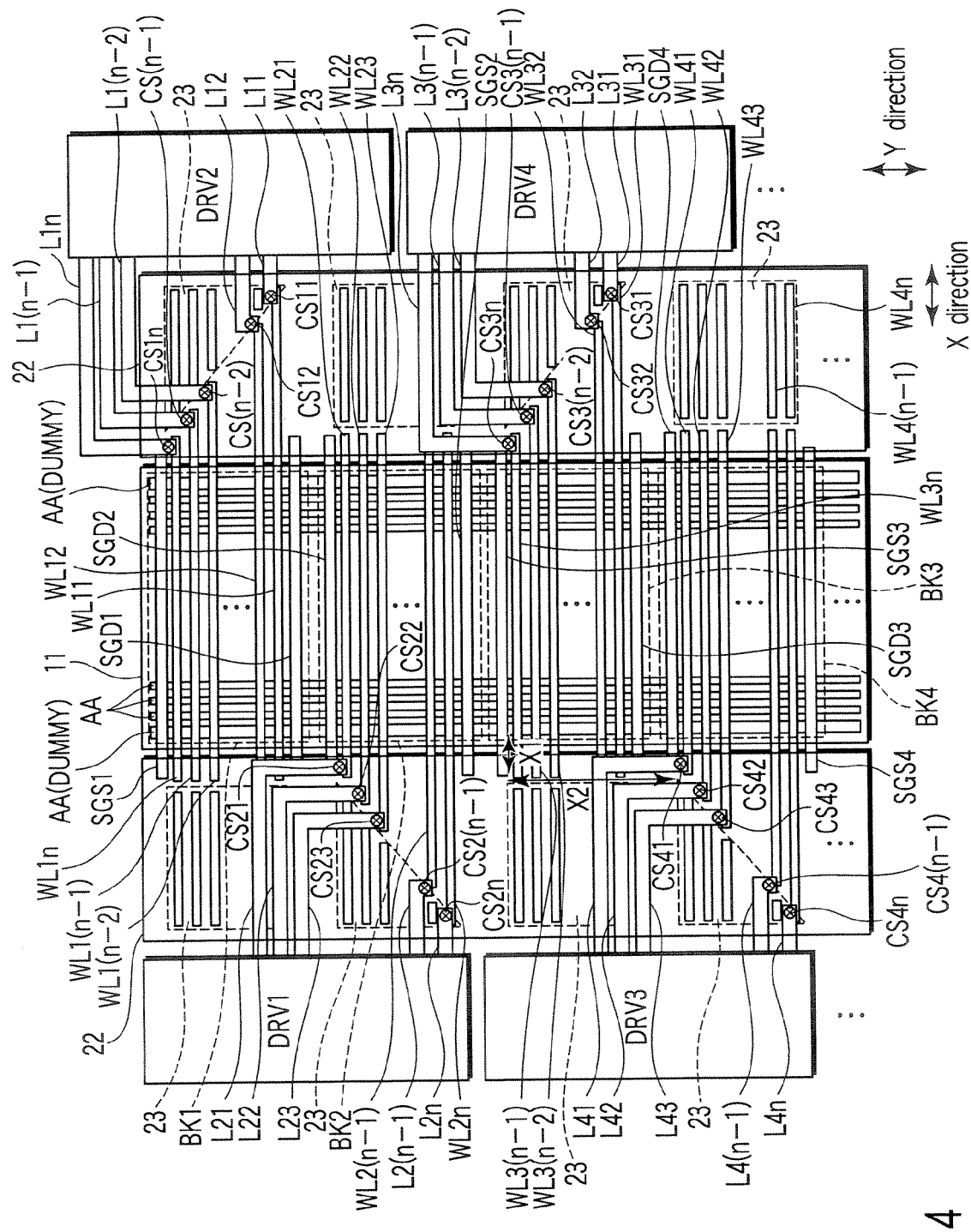
FIG. 14 is a view showing a layout as a third embodiment.

FIGS. 14 and 15 show a fourth example of the word lines layout.

The fourth example is the layout concerned with the third embodiment. The layout of the fourth example, compared with the layout of the third example, is the same as the layout of the third example except that the layout of end side to which the connecting lines of the word lines are not connected, that is, other end side of the word lines is different from the third example.

In the above described second example and third example, both one end side and other end side of the word lines WL11, WL12, . . . WL1(n−1), WL1n, . . . have the single-edge shape.

Such layout is adopted because, as described already, it is possible to prevent dimension fluctuation caused by disturbance of periodicity of the line & space by forming the pattern of the word lines WL11, WL12, . . . WL1(n−1), WL1n, . . . into a bilaterally symmetrical form.

Further, if such layout is adopted, a line is capable of being pulled out from either one of one end side and other end side of the word lines WL11, WL12, . . . WL1(n−1), WL1n, . . . without changing the layout of the connecting lines L11, L12, . . . L1(n−1), L1n, . . . , and thus freedom of design increases.

On the contrary, although in the layout of FIG. 14, one end side of the word lines WL11, WL12, . . . WL1(n−1), WL1n, . . . has the single-edge shape, other end side thereof has equal distance from an end of the memory cell array 11.

In even such layout, since the one end side of the word lines WL11, WL12, . . . WL1(n−1), WL1n, . . . has the single-edge shape, it is possible to obtain the same effect as that of the above described second and third examples.

Further, in the layout of FIG. 15, although both one end side and other end side of the word lines WL11, WL12, . . . WL1(n−1), WL1n, . . . have the single-edge shape, its direction of the single-edge shape is opposite to each other.

When adopting such layout, length of the word lines WL11, WL12, . . . WL1(n−1), WL1n, . . . becomes equal. Therefore, a signal delay amount caused by a parasitic capacitance becomes equal as well, and thus operation characteristic is improved.

(8) Fifth example of Word Lines Layout

FIG. 16 shows a fifth example of the word lines layout.

The fifth example is the layout concerned with the fourth embodiment.

In the above described second and third examples, leading out direction of the word lines, that is, the contact part between the word lines and the connecting lines is laterally interchanged in every one block. However, the leading out direction of the word lines may be laterally interchanged in every plural blocks.

The fifth example describes an example in which leading out direction of the word lines is laterally interchanged in every two blocks within the memory cell array 11.

Blocks BK1, BK2, BK3, BK4, . . . within the memory cell array 11 are arranged in y-direction. Each of the blocks BK1, BK2, BK3, BK4, . . . has a cell unit arranged in x-direction. The cell unit, for instance, having the layout shown in FIG. 3, is arranged within the active area AA.

Among the active areas AA, one or more active areas nearest to an end in x-direction of the memory cell array 11 are dummy active areas AA (DUMMY) which are not used for storing data.

The word lines WL11, WL12, . . . WL1(n−1), WL1n, . . . extend in x-direction on the memory cell array 11, and one end side and other end side thereof exist within the connecting areas 22 between the memory cell array 11 and the word line drivers DRV1, . . . .

One end side and other end side of the word lines WL11, WL12, . . . WL1(n−1), WL1n, . . . have the single-edge shape within the connecting area 22.

Incidentally, as shown in FIG. 17, one end side and other end side of the word lines WL11, WL12, ... WL1(n−1), WL1n, ... may become a double-sided edge shape as a whole of the memory cell array 11, while making direction of the single-edge in vertically opposite to each other at adjacent two blocks.

Connecting lines L11, L12, ... L1(n−1), L1n, ... for connecting the word lines WL11, WL12, WL1(n−1), WL1n, ... to the word line drivers DRV1, ... are arranged within the connecting area 22.

Width of the connecting lines L11, L12, ... L1(n−1), L1n, ... is wider than width of the word lines WL11, WL12, ... WL1(n−1), WL1n, ....

Contact holes CS11, CS12, ... CS1(n−1), CS1n, ... are arranged at one end side of the word lines WL11, WL12, ... WL1(n−1), WL1n, ....

Size of the contact holes CS11, CS12, ... CS1(n−1), CS1n, ... is larger than width of the word lines WL11, WL12, ... WL1(n−1), WL1n, ....

Further, each center point of the contact holes CS11, CS12, ... CS1(n−1), CS1n, ... is shifted gradually to one side where one end side of the word lines WL11, WL12, ... WL1(n−1), WL1n, ... approaches an end of the memory cell array 11 with respect to each center line of the word lines WL11, WL12, ... WL1(n−1), WL1n, ....

Thus, even though the diameter of the contact holes CS11, CS12, ... CS1(n−1), CS1n, ... is enlarged by forming one end side and other end side of the word lines WL11, WL12, ... WL1(n−1), WL1n, ... into the single-edge shape or the double-sided edge shape, disconnection and short circuit caused by the deviation of alignment in photolithography do not occur.

Further, since leading out direction of the word lines WL11, WL12, ... WL1(n−1), WL1n, ... is laterally interchanged in every two blocks within the memory cell array 11, it is possible to realize sharing transistors or simplification of wiring layout or the like between the two blocks, and thus to contribute to area reduction of a word line driver as the peripheral circuit.

(9) Cross-Sectional Shape of Contact Part

Figure 18:
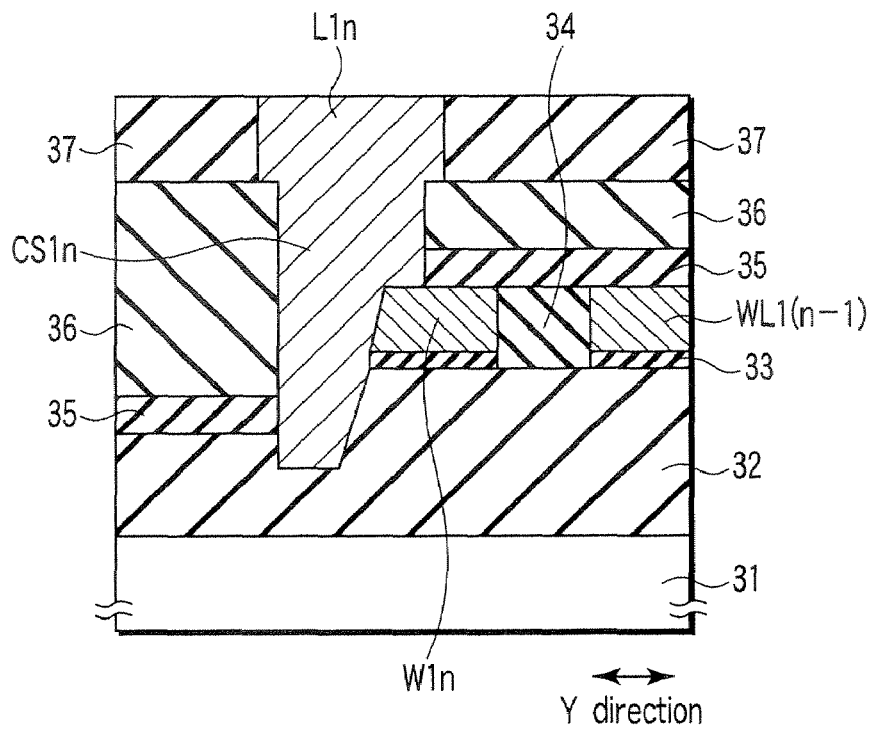
FIG. 18 is a view showing a cross-sectional shape of a contact part.

FIG. 18 shows a cross-sectional shape of a contact part between the word lines and the connecting lines.

An element isolation insulating layer 32 of STI (shallow trench isolation) structure is formed within a semiconductor substrate 31. The element isolation insulating layer 32 is composed of, for instance, silicon oxide, and its thickness is set to a value within the range of 0.1 to 0.5 μm.

Word lines WL1(n−1), WL1n are formed via a so-called IPD (inter polysilicon dielectric) layer 33 on the element isolation insulating layer 32. The word lines WL1(n−1), WL1n extend in the vertical direction to the paper face (x-direction), become control gate electrodes of the memory cell, and the word lines WL1(n−1), WL1n are composed of, for instance, conductive polysilicon including an impurity.

An insulating layer 34 of, for instance, silicon oxide or the like is filled between the word lines WL1(n−1), WL1n.

An etching stopper layer 35 is formed on the element isolation insulating layer 32 and on the word lines WL1(n−1), WL1n. Insulating layers 36, 37 made of, for instance, silicon oxide or the like are formed on the etching stopper layer 35.

A contact hole CS1n is formed on the insulating layers 36, 37, and conductive layer constituting a connecting line L1n is filled within the contact hole CS1n.

The etching stopper layer 35 is composed of the insulating layers such as, for instance, SiN, SiON or the like with thickness of 30 nm or less. The etching stopper layer 35 functions as an etching stopper when forming the contact hole CS1n while etching the insulating layers 36, 37.

Since the etching stopper layer 35 exists, it is possible to prevent the element isolation insulating layer 32 as a basis from being shaved largely and from penetrating the element isolation insulating layer 32 to the semiconductor substrate 31 when forming the contact hole CS1n.

Here, it is assumed that, in the cross section of FIG. 18, there is no deviation of alignment between the contact hole CS1n and the word line WL1n.

Figure 19:
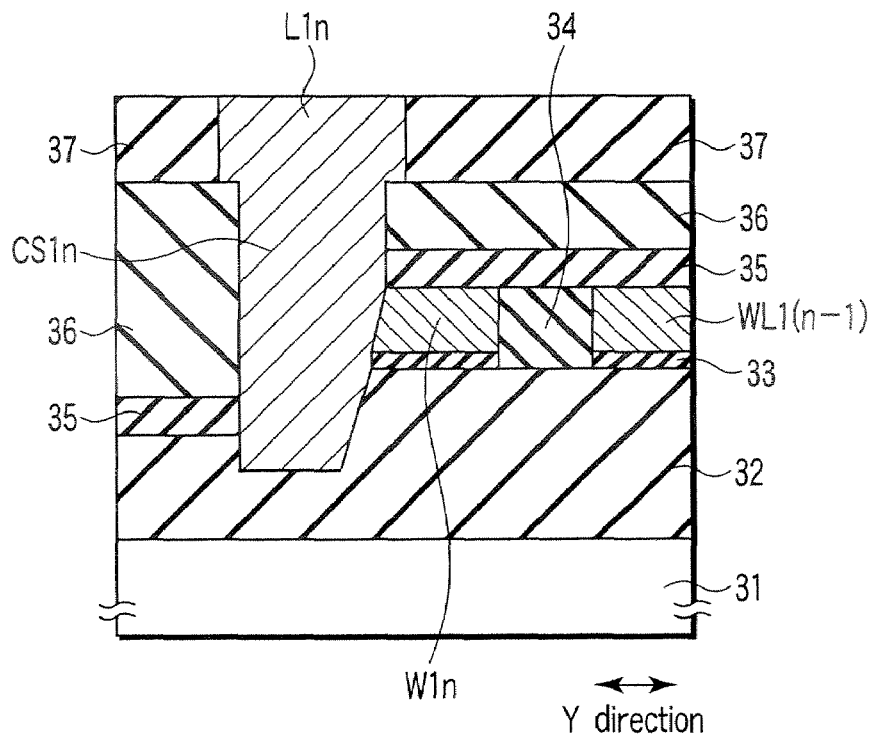
FIG. 19 is a view showing a cross-sectional shape of a contact part.

In the case where the contact hole CS1n deviates to a position opposite to the word line WL1(n−1), a cross section becomes a state shown in FIG. 19. However, since another word line does not exist on that position, large problem does not occur as long as a contact between the word line WL1n and the connecting line L1n is secured.

Figure 20:
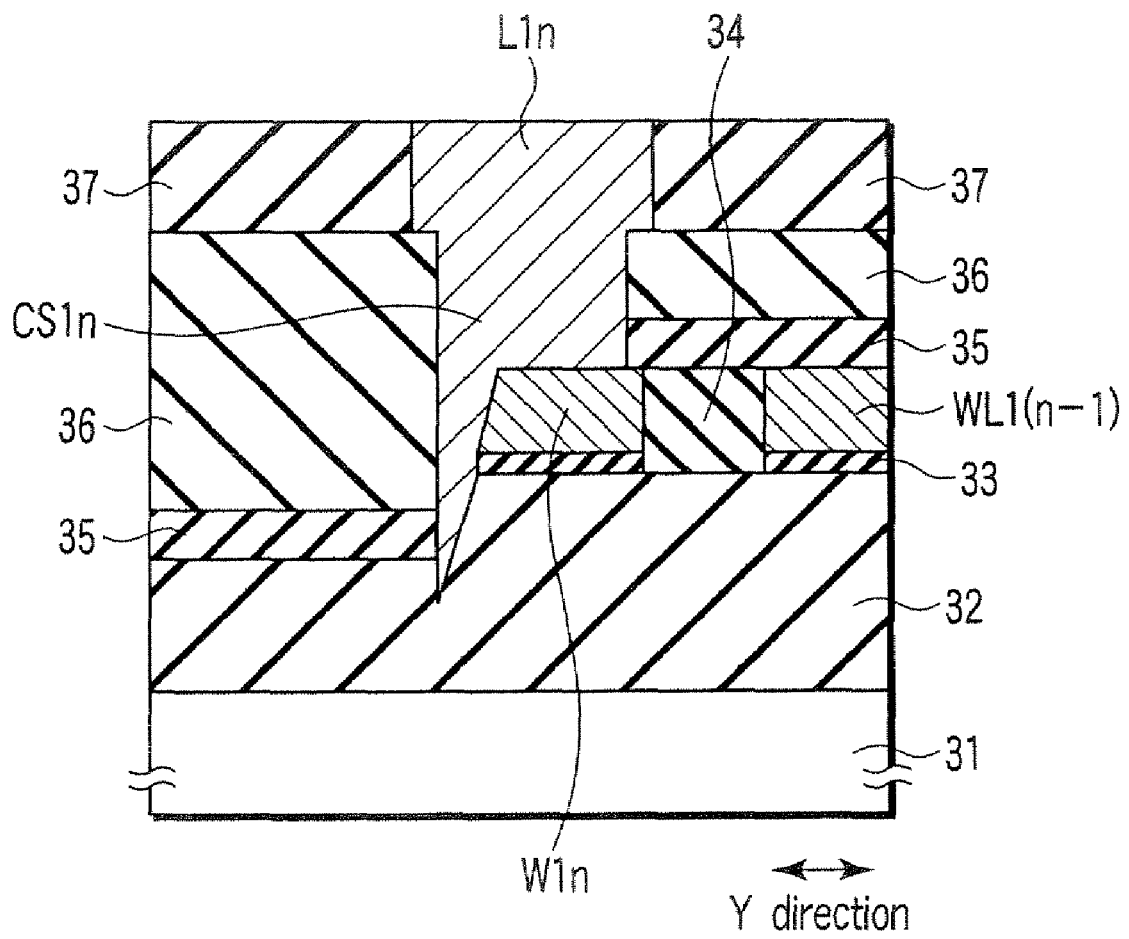
FIG. 20 is a view showing a cross-sectional shape of a contact part.

Further, in the case where the contact hole CS1n deviates to the word line WL1(n−1), a cross section becomes a state shown in FIG. 20. However, since a center point of the contact hole CS1n originally deviates to a position opposite to the word line WL1(n−1) with respect to the center line of the word line WL1(n−1), the connecting line L1n does not come into contact with the word line WL1(n−1).

By the way, even if the size of the contact hole CS1n varies by only Δd due to a variation of light exposure of the photolithography or variation of a work conversion difference when forming the contact hole CS1n, it is possible to cancel this variation amount Δd in such a way that the center point of the contact hole CS1n is caused to deviate to a position opposite to the word line WL1(n−1) with respect to the center line of the word line WL1(n−1).

Similarly, for instance, even if width of the word line WL1n varies by only Δd due to a variation of light exposure of the photolithography or variation of a work conversion difference of the word line WL1n, it is possible to cancel this variation amount Δd in such a way that the center point of the contact hole CS1n is caused to deviate to a position opposite to the word line WL1(n−1) with respect to the center line of the word line WL1(n−1).

Further, in the example of the present invention, since a fringe is not necessarily provided at one end side of the word line WL1n, it is possible to perform patterning of the word lines with simple pattern of the line & space. Therefore, it is possible to suppress variation of width of the word line WL1n, due to improvement of contrast of the photolithography.

Thus, according to the example of the present invention, a short circuit between neighboring word lines hardly occurs, and it is possible to obtain the word lines with stable shape. Further, in the case where a pattern of the line & space with a minimum pitch is formed by using, for instance, dipole lighting for lighting of the photolithography, even though resolution of an orthogonal pattern is low, patterning becomes possible.

Further, since the size of the contact holes can be made larger than the width of the word line, it is possible to form the contact holes at the same time the contact holes in the peripheral circuit are formed, and thus it is possible to decrease the number of manufacturing steps.

3. OTHERS

According to the example of the present invention, difficulty of the photolithography step or the processing step decreases, problems of contact defect or variation of cell characteristics or the like caused by variation of the size of word lines of the memory cell, variation of the size of the contact holes on the word lines, and further variation of the size of the connecting lines can be eliminated. As a result, it is possible to achieve miniaturization of LSI or simplification of processes.

Incidentally, the word lines and the connecting lines are composed of the metal or alloy such as Al, Cu, W or the like. Further, it is preferable for the word lines and the connecting lines to have a polycrystalline structure. Furthermore, in the embodiment, there has been described the word lines. However, the example of the present invention can be applied to bit lines having patterns of the line & space.

Further, as the semiconductor memory, the example of the present invention can be applied to DRAM (dynamic random access memory), MRAM (magnetic random access memory) or the like in addition to the NAND-type flash memory.

The example of the present invention can be applied to a semiconductor integrated circuit other than the semiconductor memory, for instance, a semiconductor integrated circuit having a cell array composed of array shaped element, and a conductive line having a pattern of the line & space arranged on the cell array.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a cell array composed of elements;
   conductive lines with a pattern of a line and space arranged on the cell array;
   a driving circuit which provides a signal for a selected one of the conductive lines;
   connecting lines formed above at least a portion of the conductive lines, said connecting lines connecting the conductive lines to the driving circuit and being disposed outside of the cell array; and
   contact holes which connect the conductive lines to the connecting lines,
   wherein in a sequence of a plurality of the conductive lines in a column direction, one end side of a respective conductive line extends farther away from an end of the cell array than a previous conductive line in the sequence, and
   wherein the contact holes are arranged at one end side of the conductive lines, and a size of each of the contact holes is larger than a width of each of the conductive lines.

2. The semiconductor integrated circuit according to claim 1,
   wherein each center point of the contact holes deviates to one side where each one end of the conductive lines gradually approaches an end of the cell array with respect to a center line of the conductive lines.

3. The semiconductor integrated circuit according to claim 1,
   wherein the cell array is composed of blocks, and within each block, in a sequence of a plurality of the conductive lines in a column direction, one end side of a respective conductive line extends farther away from an end of the cell array than a previous conductive line in the sequence.

4. The semiconductor integrated circuit according to claim 3,
   wherein a layout of the conductive lines within each block is identical.

5. The semiconductor integrated circuit according to claim 3,
   wherein a layout of the conductive lines within a neighboring two blocks is symmetrical.

6. The semiconductor integrated circuit according to claim 1,
   wherein a layout of one end side of the conductive lines is the same as a layout of the other end side of the conductive lines.

7. The semiconductor integrated circuit according to claim 1,
   wherein a layout of one end side of the conductive lines is different from a layout of the other end side of the conductive lines.

8. The semiconductor integrated circuit according to claim 1,
   wherein there are at least two driving circuits which provide signals to the conductive lines and which are arranged at two ends of the cell array.

9. The semiconductor integrated circuit according to claim 1,
   wherein a fringe is not formed at each one end of the conductive lines.

10. The semiconductor integrated circuit according to claim 1,
    wherein dummy conductive lines are arranged at respective distal ends from each one end of the conductive lines with a same width as the conductive lines while being separated from the conductive lines.

* * * * *